US006644386B1

United States Patent
Hsu

(10) Patent No.: US 6,644,386 B1
(45) Date of Patent: Nov. 11, 2003

(54) ENGAGING MECHANISM FOR HEAT-DISSIPATING MEMBER

(75) Inventor: Wen-Tsai Hsu, Jungli (TW)

(73) Assignee: A-Chu Chang, Taoyuan (TW)

( * ) Notice: Subject to any disclaimer, the term of this patent is extended or adjusted under 35 U.S.C. 154(b) by 0 days.

(21) Appl. No.: 10/309,679

(22) Filed: Dec. 3, 2002

(51) Int. Cl.[7] .................................................. F28F 7/00
(52) U.S. Cl. ...................................... 165/80.3; 165/185
(58) Field of Search ............................... 165/80.3, 185; 361/697, 703, 704, 706, 710; 257/706, 722; 174/16.3

(56) References Cited

U.S. PATENT DOCUMENTS

| | | | | |
|---|---|---|---|---|
| 2,434,676 A | * | 1/1948 | Spender | 165/182 |
| 5,558,155 A | * | 9/1996 | Ito | 165/80.3 |
| 6,104,609 A | * | 8/2000 | Chen | 361/695 |
| 6,336,498 B1 | * | 1/2002 | Wei | 165/80.3 |
| 6,340,056 B1 | * | 1/2002 | Huang et al. | 165/185 |
| 6,382,307 B1 | * | 5/2002 | Wang et al. | 165/80.3 |
| 6,386,275 B1 | * | 5/2002 | Kuo et al. | 165/80.3 |
| 6,401,810 B1 | * | 6/2002 | Kuo et al. | 165/185 |
| 6,446,709 B1 | * | 9/2002 | Huang | 165/80.3 |
| 6,449,160 B1 | * | 9/2002 | Tsai | 361/709 |
| 6,474,407 B1 | * | 11/2002 | Chang et al. | 165/80.3 |

* cited by examiner

*Primary Examiner*—Terrell McKinnon
(74) *Attorney, Agent, or Firm*—Pro-Techtor International Services

(57) ABSTRACT

A heat-dissipating member includes a sheet, an upper extension, and a lower extension. Each extension includes an engaging portion having a pair of opposed engaging hooks with an engaging slot defined therebetween. Each engaging hook is connected to an associated extension via a slant lug. Each engaging portion includes a rear portion extending into an associated extension, thereby leaving a notched portion on an associated end of the sheet. The slant lugs of the engaging portion of the heat-dissipating member are extendible into a rear portion of an engaging slot of another similarly constructed heat-dissipating member, with two edges of a notched portion of another similarly constructed heat-dissipating member being engaged with the engaging hooks of the heat dissipating member.

6 Claims, 8 Drawing Sheets

ENGAGING MECHANISM FOR HEAT-DISSIPATING MEMBER

BACKGROUND OF THE INVENTION

1. Field of the Invention

The present invention relates to an engaging mechanism for a heat-dissipating member. In particular, the present invention relates to a thin metal sheet type heat-dissipating member having an engaging mechanism to allow a plurality of the heat-dissipating members to line up.

2. Description of the Related Art

A conventional heat-dissipating device generally comprises a plurality of rows of fins for intimate contact with a heat-generating member for heat dissipating purposes with cooperation of an active cooling element. Thus, the overall area of the fins is the main factor of heat dissipation. An integral heat-dissipating member with a high conductivity is the best option, yet the cost is high. An alternative way is to line up a plurality of heat-dissipating members until a desired overall area for heat dissipation is obtained. However, positioning means and engaging means are required for the heat-dissipating members, and the subsequent procedure for securely engaging the heat-dissipating members together is troublesome and time-consuming. A current solution is to provide protrusions and depressions on each heat-dissipating member, yet the result was found unsatisfactory.

SUMMARY OF THE INVENTION

An object of the present invention is to provide a thin metal sheet type heat-dissipating member having an engaging mechanism formed by means of direct punching to allow rapid and reliable engagement between two heat-dissipating members. The thin metal sheet type heat-dissipating member is suitable for continuous automatic punching operation that saves labor, time, and cost.

A heat-dissipating member in accordance with the present invention comprises:

- a sheet including an upper end and a lower end and lying on a plane;
- an upper extension projecting from the upper end of the sheet and extending along a direction perpendicular to the plane;
- a lower extension projecting from the lower end of the sheet and parallel to the upper extension;
- each of the upper extension and the lower extension including an engaging portion, each said engaging portion including a pair of opposed engaging hooks having an engaging slot defined therebetween, each said engaging hook extending beyond an associated one of the upper extension and the lower extension and being connected to an associated one of the upper extension and the lower extension via a slant lug, each said engaging portion including a front portion distal to an associated one of the upper extension and the lower extension, each said engaging portion further including a rear portion proximal to an associated one of the upper extension and the lower extension, the rear portion of each said engaging portion extending into an associated one of the upper extension and the lower extension, thereby leaving a notched portion on an associated one of the upper end and the lower end of the sheet;
- wherein the slant lugs of the engaging portion of the heat-dissipating member are extendible into a rear portion of an engaging slot of another similarly constructed heat-dissipating member, with two edges of a notched portion of another similarly constructed heat-dissipating member being engaged with the engaging hooks of the heat-dissipating member.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
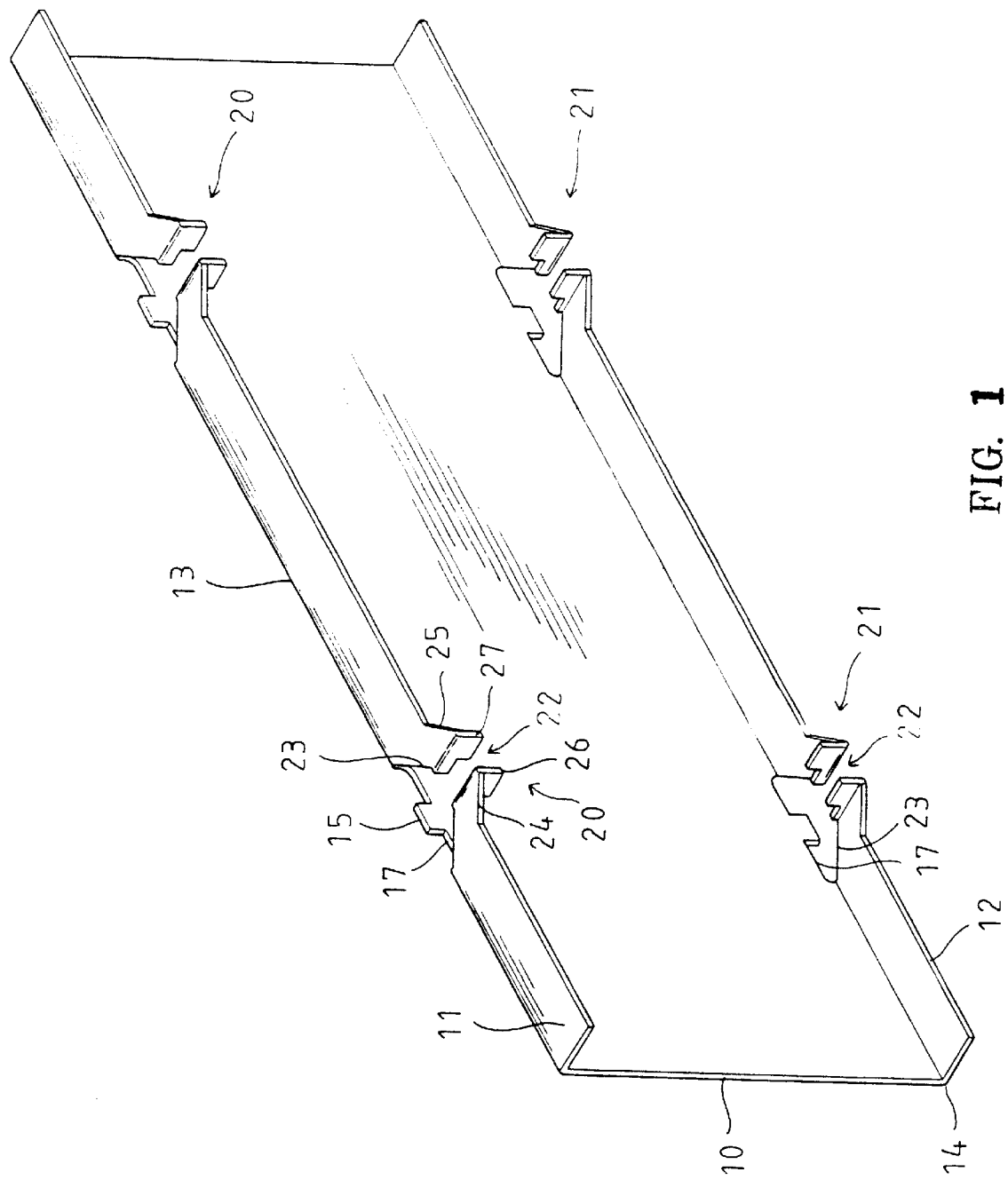
FIG. 1 is a perspective view of a heat-dissipating member in accordance with the present invention.
Figure 2:
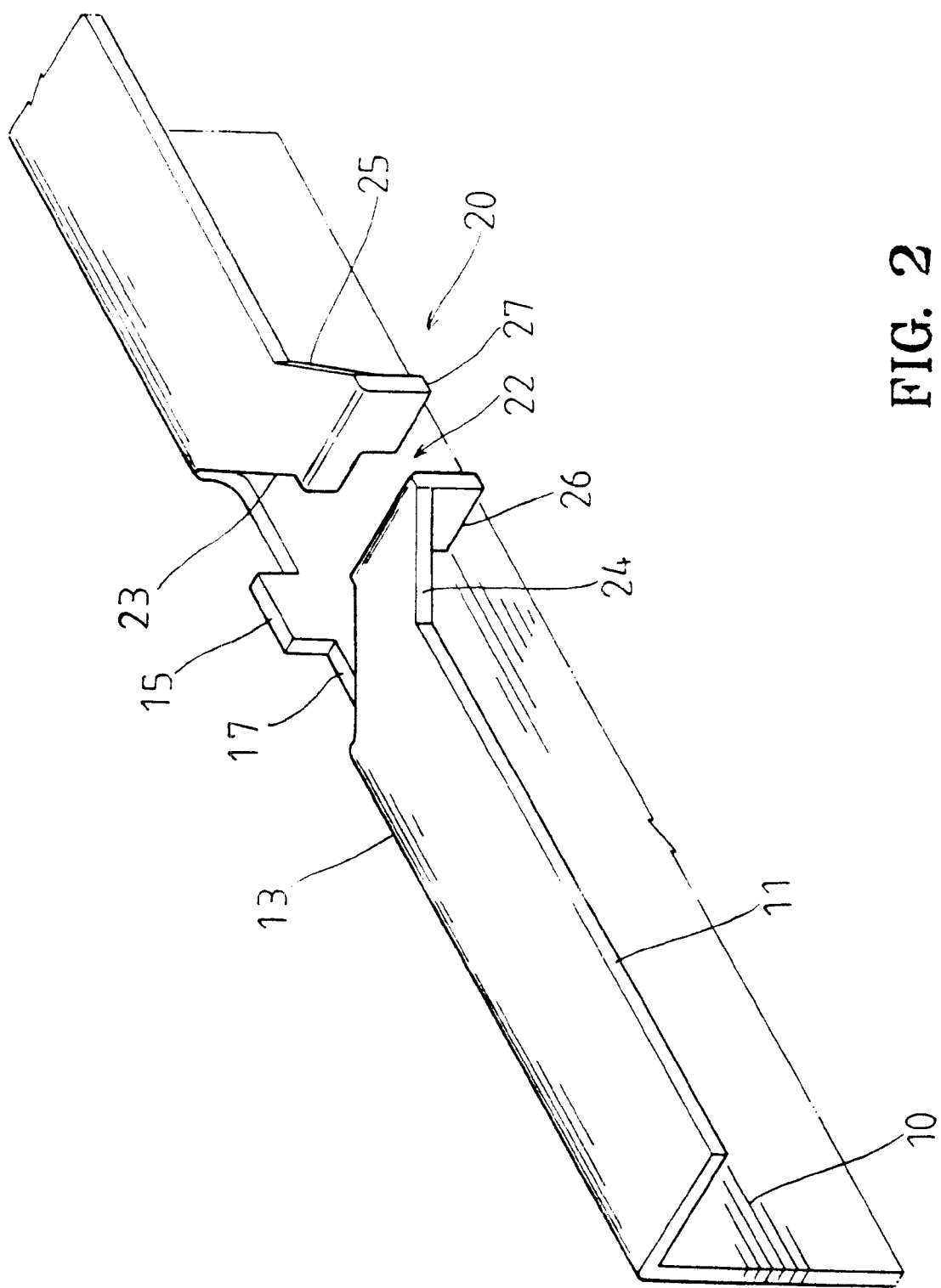
FIG. 2 is a perspective view, in an enlarged scale, of a portion of the heat-dissipating member in accordance with the present invention.

Referring to FIGS. 1 and 2, a heat-dissipating member in accordance with the present invention is generally a thin metal sheet 10 having an upper extension 11 on an upper end 13 thereof and a lower extension 12 on a lower end 14 thereof. The upper extension 11 projects from the upper end 13 of the thin metal sheet 10 and extends along a direction perpendicular to a general plane on which the thin metal sheet 10 lies. The lower extension 12 projects from the lower end 14 of the thin mental sheet 10 and is parallel the upper extension 11. The width of each extension 11, 12 is predetermined. At least one engaging portion 20 is provided on the upper extension 11, and at least one engaging portion 21 is provided on the lower extension 11.

Each engaging portion 20, 21 includes two opposed engaging hooks 26 and 27 that are spaced by an engaging slot 22. The engaging slot 22 includes a front end distal to the associated extension 11, 12 and a rear portion 23 proximal to the associated extension 11, 12. The rear portion 23 of the engaging slot 22 is wider than the front portion of the engaging slot 22 and adjacent to the associated extension 11, 12. The rear portion 23 of the engaging slot 22 extends to the associated extension 11, 12, thereby leaving a notched portion 17 on an associated one of the upper end 13 and the lower end 14 of the thin metal sheet 10. A stop 15 is formed on the notched portion 17 and is aligned with a front portion of the engaging slot 22. The stop 15 has a width equal to the width of the front portion of the engaging slot 22. Each engaging hook 26, 27 extends in a direction perpendicular to the associated extension 11, 12 and is connected to the associated extension 11, 12 by a slant lug 24, 25. Each engaging hook 26, 27 extends to a position beyond the associated extension 11, 12. Each slant lug 24, 25 has a front end and a rear end wider than the front end.

Figure 3:
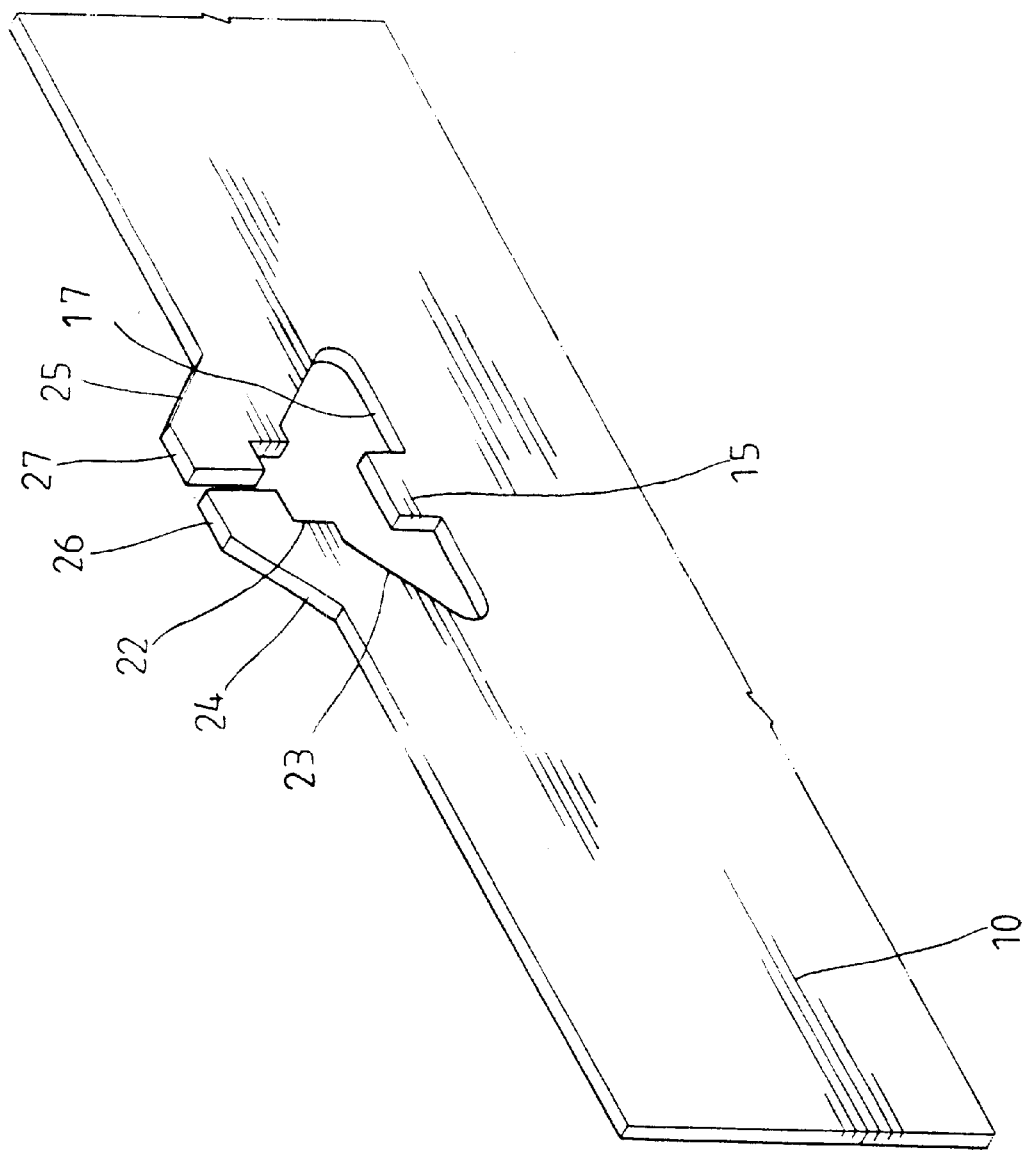
FIGS. 3 and 4 are perspective views illustrating semi-products of the heat-dissipating member in accordance with the present invention.
Figure 4:
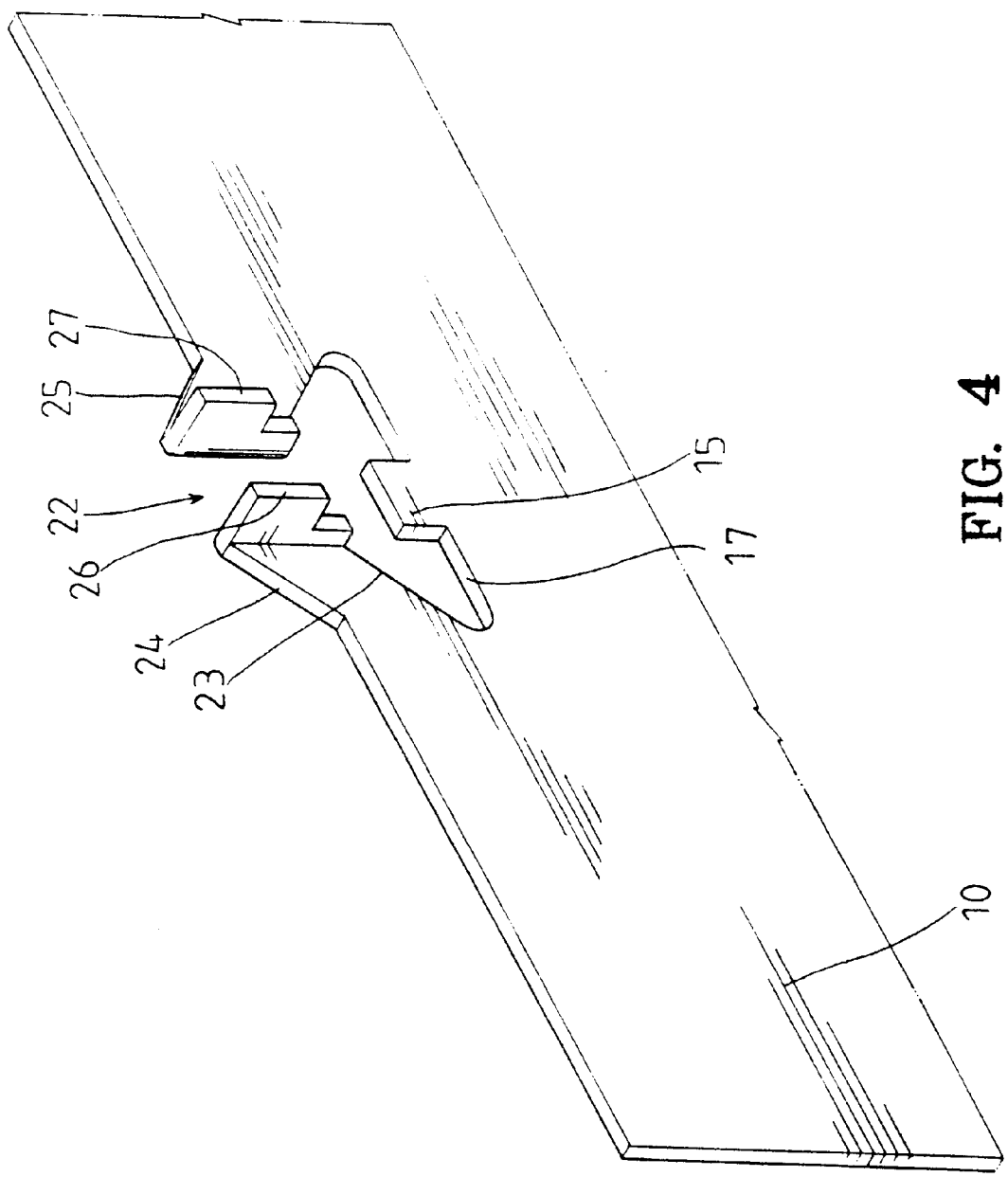

The engaging portions 20 and 21 are identical and formed in the same procedure. FIGS. 3 and 4 illustrate semi-products of a punching process for manufacturing the heat-dissipating member in accordance with the present invention. As illustrated in FIG. 3, a thin metal sheet 10 is punched to form the engaging slot 22, the wider portion 23, the stop 15, the lugs 24 and 25, and engaging hooks 26 and 27. Next, the engaging hooks 26 and 27 are bent to a position shown in FIG. 4. Then, the thin metal sheet 10 is bent along a longitudinal direction to form a structure shown in FIG. 2.

Figure 5:
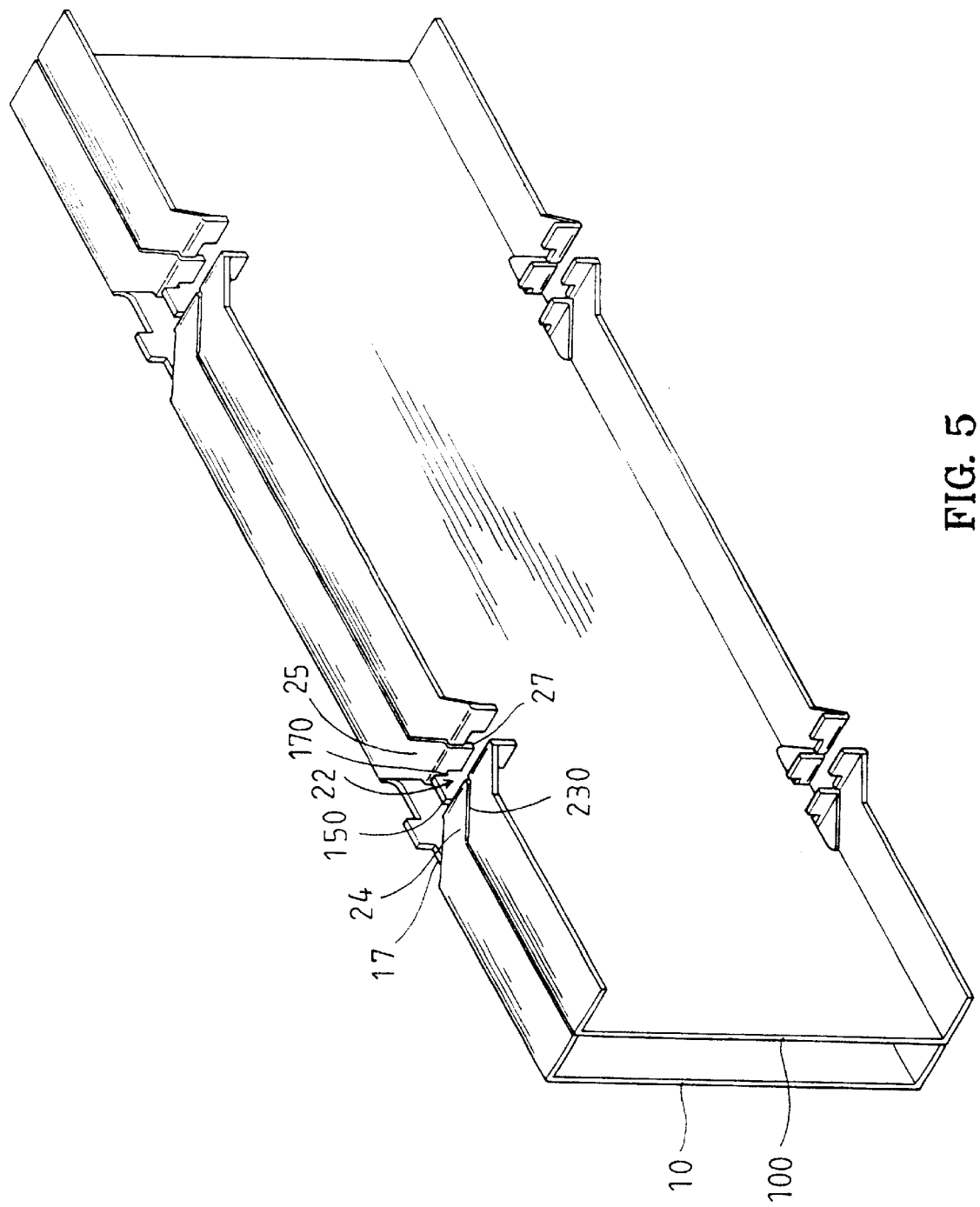
FIG. 5 is a perspective view illustrating lining up of two heat-dissipating members in accordance with the present invention.
Figure 6:
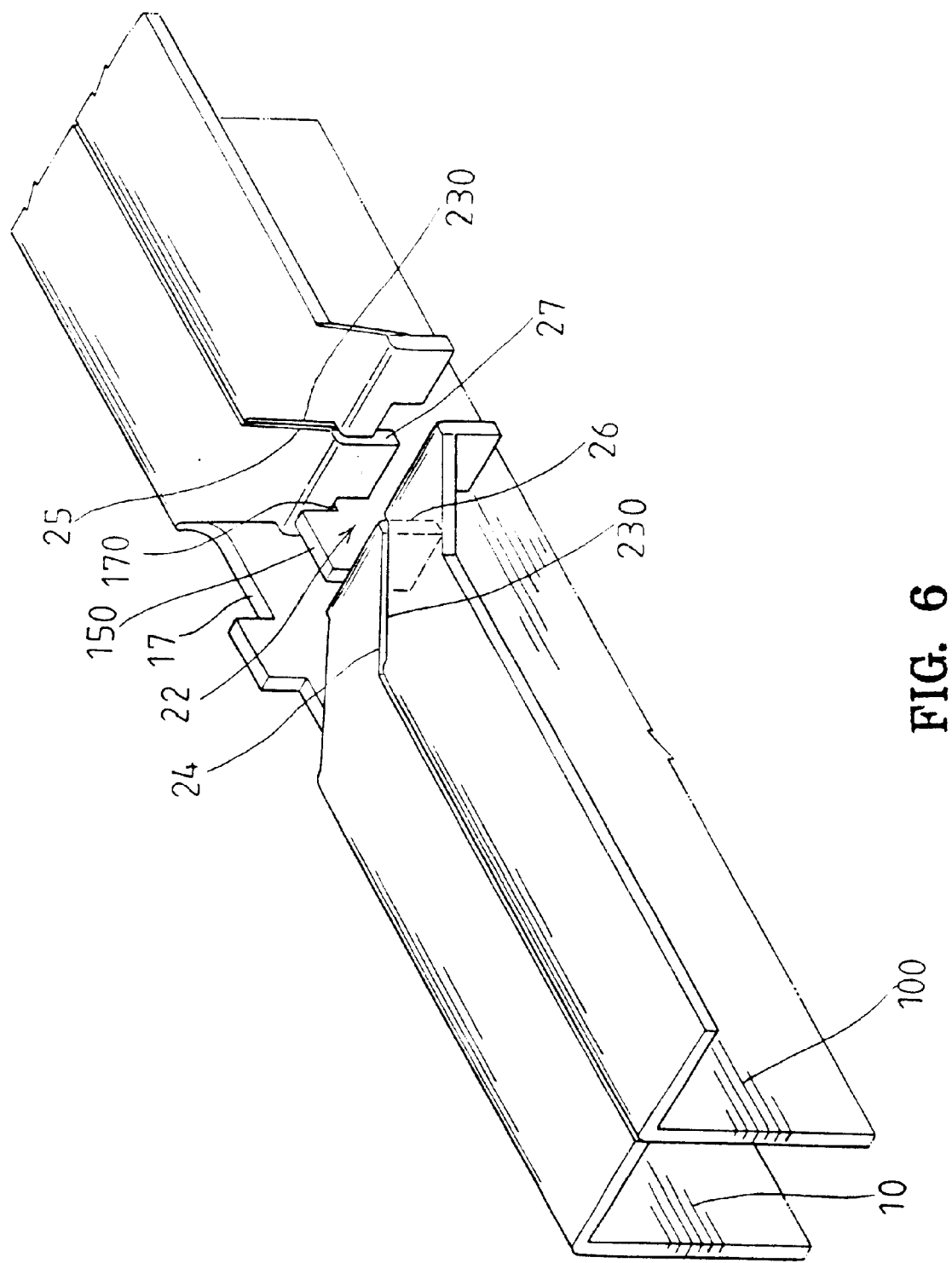
FIG. 6 is perspective view, in an enlarged scale, of a portion of the heat-dissipating members in FIG. 5.
Figure 7:
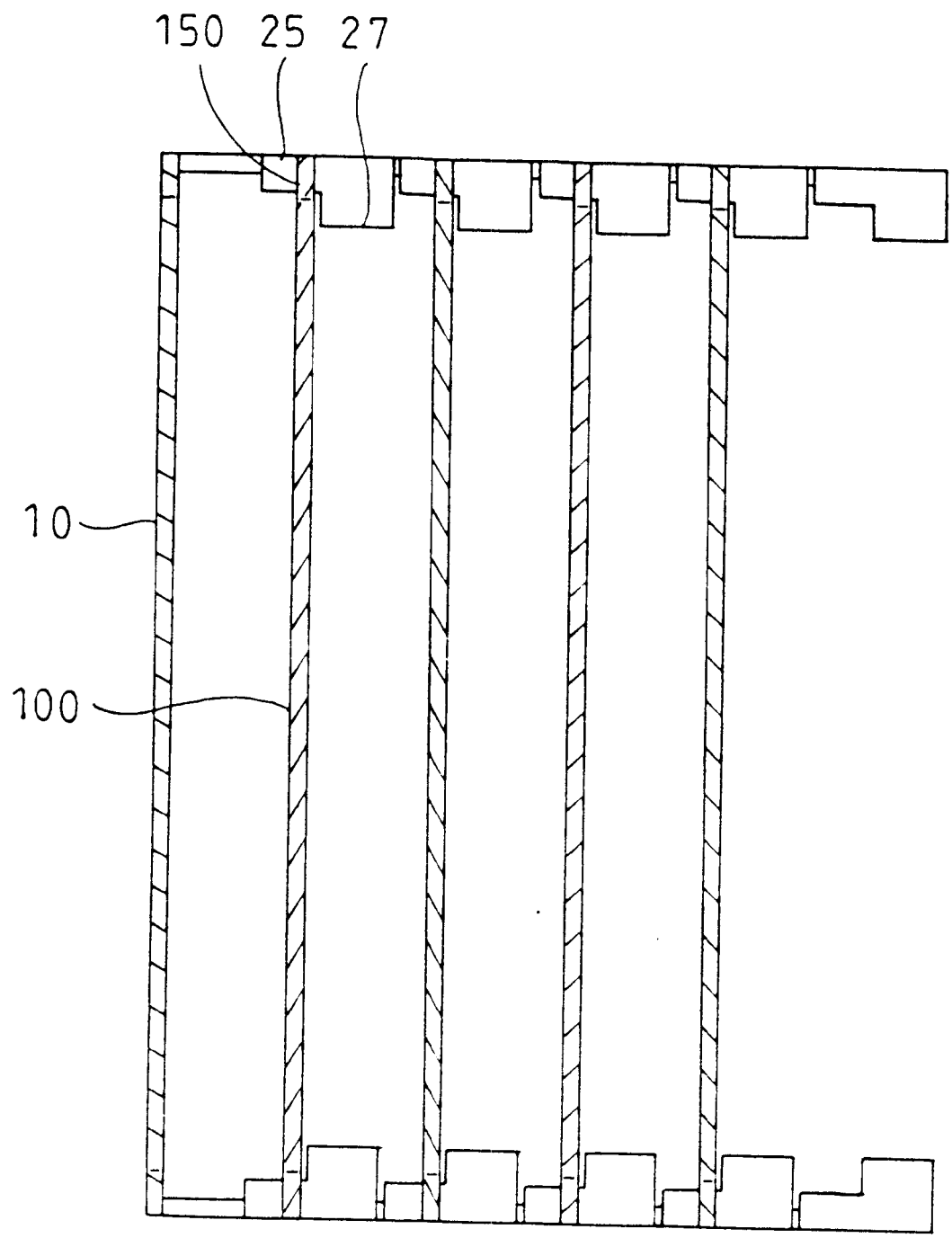
FIG. 7 is a sectional view illustrating engagement of a plurality of heat-dissipating members in accordance with the present invention.

The engaging portion 20, 21 allows easy alignment of two heat-dissipating members 10 and 100, as shown in FIGS. 5 through 7. The slant lugs 24 and 25 of the thin metal sheet 10 are inserted into the rear wider portion 230 of the engaging slot 240 of the other thin metal sheet 100. The front portion of the engaging slot 22 of the thin metal sheet 10 receives the stop 150 of the other thin metal sheet 100. The engaging hooks 26 and 27 of the thin metal sheet 10 respectively engage with two end edges of the notched portion 170 of the other thin metal sheet 100. Thus, the heat-dissipating members can be connected as many as desired, best shown in FIG. 7.

Figure 8:
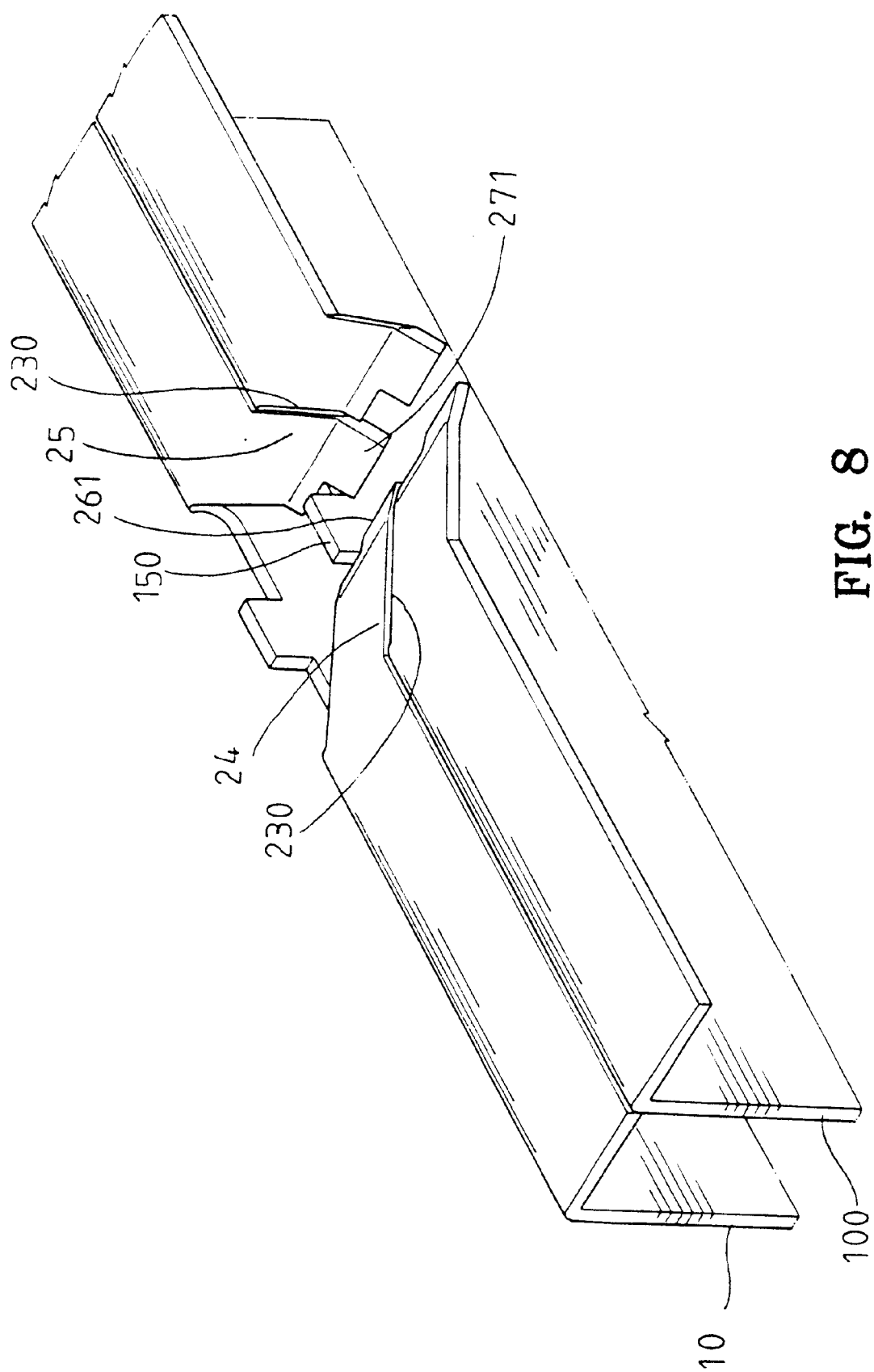
FIG. 8 is a perspective view illustrating two heat-dissipating members in accordance with another embodiment of the present invention.

FIG. 8 illustrates another embodiment of the invention, wherein the engaging hook 261, 271 of the thin metal sheet 10 is inclined toward each other and thus locates in front of the stop 150 of the other thin metal sheet 100 to thereby hold the, stop 150 of the other thin metal sheet 100. Thus, disengagement of the thin metal sheet 10 from the other thin metal sheet 100 by moving the thin metal sheet 10 rearward away from the other thin metal sheet 100 is avoided.

According to the above description, it is appreciated that the heat-dissipating member in accordance with the present invention may have engaging portions 20, 21 directly formed thereon by punching, which is suitable for continuous automatic punching and saves labor, time, and cost.

Although the invention has been explained in relation to its preferred embodiment, it is to be understood that many other possible modifications and variations can be made without departing from the scope of the invention as hereinafter claimed.

What is claimed is:

1. A heat-dissipating member comprising:
   a sheet including an upper end and a lower end and lying on a plane;
   an upper extension projecting from the upper end of the sheet and extending along a direction perpendicular to the plane;
   a lower extension projecting from the lower end of the sheet and parallel to the upper extension;
   each of the upper extension and the lower extension including an engaging portion, each said engaging portion including a pair of opposed engaging hooks having an engaging slot defined therebetween, each said engaging hook extending beyond an associated one of the upper extension and the lower extension and being connected to an associated one of the upper extension and the lower extension via a slant lug, each said engaging portion including a front portion distal to an associated one of the upper extension and the lower extension, each said engaging portion further including a rear portion proximal to an associated one of the upper extension and the lower extension, the rear portion of each said engaging portion extending into an associated one of the upper extension and the lower extension, thereby leaving a notched portion on an associated one of the upper end and the lower end of the sheet;
   wherein the slant lugs of the engaging portion of the heat-dissipating member are extendible into a rear portion of an engaging slot of another similarly constructed heat-dissipating member, with two edges of a notched portion of another similarly constructed, heat-dissipating member being engaged with the engaging hooks of the heat-dissipating member.

2. The heat-dissipating member as claimed in claim 1, wherein the rear portion of each said engaging slot is wider that the front portion of the engaging slot.

3. The heat-dissipating member as claimed in claim 1, wherein each said slant lug has a front end and a rear end wider than the front end.

4. The heat-dissipating member as claimed in claim 1, wherein each engaging hook of the heat-dissipating member extends along a direction perpendicular to an associated one of the upper extension and the lower extension.

5. The heat-dissipating member as claimed in claim 1, wherein each said notched portion of the heat-dissipating member has a stop formed thereon, the stop having a width equal to a width of the front portion of the engaging slot of the heat-dissipating member.

6. The heat-dissipating member as claimed in claim 5, wherein each said engaging hook of the heat-dissipating member is inclined, and wherein said engaging hooks of the heat-dissipating member together hold a stop of another similarly constructed heat-dissipating member.

\* \* \* \* \*